United States Patent
Iwai

(10) Patent No.: US 12,255,801 B2
(45) Date of Patent: Mar. 18, 2025

(54) SIGNAL GENERATOR AND EMPHASIS SWITCHING METHOD USING SIGNAL GENERATOR

(71) Applicant: ANRITSU CORPORATION, Kanagawa (JP)

(72) Inventor: Tatsuya Iwai, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 0 days.

(21) Appl. No.: 18/335,419

(22) Filed: Jun. 15, 2023

(65) Prior Publication Data

US 2024/0080254 A1    Mar. 7, 2024

(30) Foreign Application Priority Data

Sep. 2, 2022 (JP) ................................. 2022-139841

(51) Int. Cl.
   *H03H 17/06*    (2006.01)
   *H03H 17/00*    (2006.01)
   *H04L 43/50*    (2022.01)

(52) U.S. Cl.
   CPC ..... *H04L 43/50* (2013.01); *H03H 2017/0081* (2013.01); *H03H 17/06* (2013.01)

(58) Field of Classification Search
   CPC .. H03H 17/06; H03H 2017/0081; H03K 3/64; H03K 2005/00013; H04B 3/04
   USPC ......... 375/224, 229, 232, 350; 708/301, 322
   See application file for complete search history.

(56) References Cited

U.S. PATENT DOCUMENTS

| 7,793,013 | B1* | 9/2010 | Esposito ............ H03H 17/0223 710/33 |
| 9,098,435 | B1* | 8/2015 | Nelson ..................... G06F 17/14 |
| 10,778,192 | B2* | 9/2020 | Hosaka ............. H03H 17/0294 |
| 2010/0177816 | A1* | 7/2010 | Malipatil .......... H04L 25/03343 375/232 |
| 2012/0042287 | A1 | 2/2012 | Saito et al. |
| 2019/0348970 | A1* | 11/2019 | Skinner ............. H03H 17/0294 |
| 2021/0305976 | A1* | 9/2021 | Ishii ......................... H03G 5/16 |
| 2022/0029667 | A1* | 1/2022 | Dhananjay ............... H04B 7/10 |

FOREIGN PATENT DOCUMENTS

JP            5496940 B2    5/2014

* cited by examiner

*Primary Examiner* — Young T. Tse
(74) *Attorney, Agent, or Firm* — McDonald Hopkins LLC

(57) ABSTRACT

There are provided a signal generator capable of flexibly increasing the number of taps while realizing high-speed emphasis switching and an emphasis switching method using the signal generator. A signal generator includes: an emphasis addition circuit including at least one finite impulse response (FIR) filter unit that generates an emphasis waveform pattern by adding an emphasis to a pattern of a pulse amplitude modulation (PAM) signal including multi-values which are two or more values; and a tap value setting unit that switches M tap values C(0), C(−1), . . . , and C(1−M) and sets the M tap values C(0), C(−1), . . . , and C(1−M) to each FIR filter unit according to an emphasis switching request from a DUT 100. The FIR filter unit is configured on an FPGA or an ASIC.

8 Claims, 8 Drawing Sheets

First clock

|       | $b_0$ | $b_1$ | $b_2$ | $b_3$ | $b_4$ | $b_5$ | $b_6$ | $b_7$ |
|-------|-------|-------|-------|-------|-------|-------|-------|-------|
| Lane 1 | bit1 | bit1 | bit1 | bit1 | bit1 | bit1 | bit1 | bit1 |
| Lane 2 | bit2 | bit2 | bit2 | bit2 | bit2 | bit2 | bit2 | bit2 |
| Lane 3 | bit3 | bit3 | bit3 | bit3 | bit3 | bit3 | bit3 | bit3 |
| Lane 4 | bit4 | bit4 | bit4 | bit4 | bit4 | bit4 | bit4 | bit4 |

Second clock

|       | $b_8$ | $b_9$ | $b_{10}$ | $b_{11}$ | $b_{12}$ | $b_{13}$ | $b_{14}$ | $b_{15}$ |
|-------|-------|-------|----------|----------|----------|----------|----------|----------|
| Lane 1 | bit1 | bit1 | bit1 | bit1 | bit1 | bit1 | bit1 | bit1 |
| Lane 2 | bit2 | bit2 | bit2 | bit2 | bit2 | bit2 | bit2 | bit2 |
| Lane 3 | bit3 | bit3 | bit3 | bit3 | bit3 | bit3 | bit3 | bit3 |
| Lane 4 | bit4 | bit4 | bit4 | bit4 | bit4 | bit4 | bit4 | bit4 |

FIG. 6

SIGNAL GENERATOR AND EMPHASIS SWITCHING METHOD USING SIGNAL GENERATOR

TECHNICAL FIELD

The present invention relates to a signal generator and an emphasis switching method using a signal generator.

BACKGROUND ART

In a compliance test to check whether a device under test (DUT) conforms to a communication standard such as peripheral component interconnect express (PCIe, registered trademark) or 400 gigabit ethernet (GbE), as a bit rate of a test signal which is output from a transmission-side signal generator (pulse pattern generator: PPG) to the DUT increases, it is necessary to set an emphasis of the test signal to ensure a quality. At this time, it is necessary to switch a waveform of the test signal at a high speed according to an emphasis switching request from the DUT. For example, in the PCIe standard, it is required that the waveform of the test signal is switched in a switching time equal to or shorter than 1 μs.

In the PPG that generates a non-return-to-zero (NRZ) signal, a pulse amplitude modulation 4 (PAM4) signal, and the like as a test signal, an emphasis addition circuit that adds an emphasis to a pattern of the test signal usually has a finite impulse response (FIR) filter structure, and is configured with an integrated circuit (IC) closest to the DUT (refer to, for example, Patent Document 1).

FIG. 8 is a circuit diagram illustrating a schematic configuration of an FIR filter 60 used for emphasis addition. The FIR filter 60 is a circuit that delays an input pattern by 1 unit interval (UI) and outputs values obtained by performing a product-sum operation with tap values for emphasis addition. For example, the FIR filter 60 includes four-stage delay circuits 61a to 61d that sequentially delay an input pattern by 1 UI and output the delayed pattern, five multipliers 62a to 62e that respectively multiply pieces of n-th to (n+4)-th data $a_n$ to $a_{n+4}$ of the input pattern by five tap values C(−4), C(−3), C(−2), C(−1), and C(0), and four adders 63a to 63d that add output values of the five multipliers 62a to 62e and output a pattern to which an emphasis is added. Note that the number of computation units is only an example.

In the FIR filter 60, the delay circuits 61a to 61d are configured with, for example, D flip-flops, and respectively output the same value as an input value at a rising timing or a falling timing of an input clock.

Here, the multiplier 62a multiplies (n+4)-th data $a_{n+4}$ of the pattern, which is not delayed, by the tap value C(−4). The multiplier 62b multiplies (n+3)-th data $a_{n+3}$ of the pattern, which is delayed by 1 UI by the delay circuit 61a, by the tap value C(−3). The multiplier 62c multiplies (n+2)-th data $a_{n+2}$ of the pattern, which is delayed by 2 UI by the delay circuits 61a and 61b, by the tap value C(−2). The multiplier 62d multiplies (n+1)-th data $a_{n+1}$ of the pattern, which is delayed by 3 UI by the delay circuits 61a to 61c, by the tap value C(−1). The multiplier 62e multiplies n-th data $a_n$ of the pattern which is delayed by 4 UI by the delay circuits 61a to 61d, by the tap value C(0).

Further, the adder 63d adds an output value of the multiplier 62d and an output value of the multiplier 62e. The adder 63c adds an output value of the adder 63d and an output value of the multiplier 62c. The adder 63b adds an output value of the adder 63c and an output value of the multiplier 62b. The adder 63a adds an output value of the adder 63b and an output value of the multiplier 62a. Thereby, a value obtained by adding all the output values of the multipliers 62a to 62e is output.

RELATED ART DOCUMENT

Patent Document

[Patent Document 1] Japanese Patent No. 5496940

DISCLOSURE OF THE INVENTION

Problem that the Invention is to Solve

However, in the structure disclosed in Patent Document 1, the number of taps is determined by IC design. As a result, there is a problem that the number of taps once determined cannot be increased later in accordance with changes in standards.

In addition, in the structure disclosed in Patent Document 1, a hardware switch is introduced for emphasis switching. As a result, there are also a problem that a mounting area of the entire FIR filter increases and this makes it difficult to realize multiple taps and a problem that it is difficult to flexibly switch the tap values.

The present invention has been made to solve such problems in the related art, and an object of the present invention is to provide a signal generator capable of flexibly increasing the number of taps while realizing high-speed emphasis switching and an emphasis switching method using the signal generator.

Means for Solving the Problem

In order to solve the problems, according to the present invention, there is provided a signal generator including: an emphasis addition circuit including at least one finite impulse response (FIR) filter unit that generates an emphasis waveform pattern by adding an emphasis to a pattern of a pulse amplitude modulation (PAM) signal including multi-values which are two or more values; and a tap value setting unit that switches M tap values C(0), C(−1), . . . , and C(1−M) and sets the M tap values C(0), C(−1), . . . , and C(1−M) to each FIR filter unit according to an emphasis switching request from a device under test, in which the FIR filter unit includes a delay unit that respectively delays, among pieces of n-th to (n+M−1)-th data included in the pattern of the PAM signal, pieces of (n+1)-th to (n+M−1)-th data by a predetermined delay amount with respect to pieces of data immediately before the pieces of (n+1)-th to (n+M−1)-th data and outputs the delayed data, and that respectively outputs the tap values C(0), C(−1), . . . , and C(1−M) at the same timing as the pieces of n-th to (n+M−1)-th data, a plurality of multipliers that respectively multiply the pieces of n-th to (n+M−1)-th data which are output from the delay unit by the tap values C(0), C(−1), . . . , and C(1−M) which are output from the delay unit and output the multiplied data, and a plurality of adders that generate the emphasis waveform pattern by adding output values of the plurality of multipliers, and the FIR filter unit is configured on a field programmable gate array (FPGA) or an application specific integrated circuit (ASIC).

With the configuration, the signal generator according to the present invention can add an emphasis to a pattern of a PAM signal including multi-values, which are two or more values, by using at least one FIR filter unit. In addition, the signal generator according to the present invention can switch a final output waveform at a high speed by switching the M tap values C(0), C(−1), ..., and C(1−M) to be input to each FIR filter unit. Further, in the signal generator according to the present invention, the emphasis addition circuit including at least one FIR filter unit is configured on the FPGA or the ASIC. Thereby, even in a case where the number of required taps increases due to a future standard trend, it is possible to flexibly increase the number M of taps and the number N of output bits while realizing high-speed emphasis switching.

Further, in the signal generator according to the present invention, the emphasis addition circuit may be configured by providing a plurality of circuit configurations of the FIR filter units in parallel, and may output a plurality of pieces of data included in the emphasis waveform pattern at the same clock timing.

Further, in the signal generator according to the present invention, the tap value setting unit may include an emphasis setting table that stores a plurality of sets of the tap values C(0), C(−1), ..., and C(1−M) defined by a standard, and an emphasis switching instruction unit that selects, from the emphasis setting table, the tap values C(0), C(−1), ..., and C(1−M) to be newly set to each FIR filter unit according to the switching request from the device under test and outputs the selected tap values C(0), C(−1), ..., and C(1−M) from the emphasis setting table.

With the configuration, the signal generator according to the present invention can select, from the emphasis setting table, the tap values C(0), C(−1), ..., and C(1−M) according to a switching request from the device under test, and set the selected tap values C(0), C(−1), ..., and C(1−M) to each FIR filter unit.

Further, in the signal generator according to the present invention, the plurality of multipliers and the plurality of adders may be configured in a digital signal processor (DSP).

With the configuration, in the signal generator according to the present invention, each FIR filter unit is configured using the DSP. Thereby, it is possible to efficiently use resources of the FPGA or the ASIC, and it is possible to flexibly increase the number M of taps and the number N of output bits in a case where the number of required taps increases due to a future standard trend.

Further, the signal generator according to the present invention may further include an N-bit digital-to-analog converter (DAC) that outputs an analog signal according to the emphasis waveform pattern which is output from the emphasis addition circuit to the device under test. The FIR filter unit may further include an N-bit conversion unit that generates the N-bit emphasis waveform pattern by converting the output values of the plurality of multipliers, which are obtained after being added by the plurality of adders, into integer values within a range from 0 to $2^N-1$.

With the configuration, the signal generator according to the present invention is configured to input the N-bit emphasis waveform pattern from the emphasis addition circuit to the N-bit DAC and generate the test signal for the device under test. Thereby, it is possible to increase a bit rate and add an emphasis. Therefore, it is possible to realize a signal generator with high waveform switching performance according to the multi-values.

Further, according to the present invention, there is provided an emphasis switching method including: an emphasis addition step of generating an emphasis waveform pattern by adding an emphasis to a pattern of a pulse amplitude modulation (PAM) signal including multi-values which are two or more values by at least one finite impulse response (FIR) filter unit configured on a field programmable gate array (FPGA) or an application specific integrated circuit (ASIC); and a tap value setting step of switching M tap values C(0), C(−1), ..., and C(1−M) and setting the M tap values C(0), C(−1), ..., and C(1−M) to each FIR filter unit according to an emphasis switching request from a device under test, in which the emphasis addition step includes a delay step of respectively delaying, among pieces of n-th to (n+M−1)-th data included in the pattern of the PAM signal, pieces of (n+1)-th to (n+M−1)-th data by a predetermined delay amount with respect to pieces of data immediately before the pieces of (n+1)-th to (n+M−1)-th data and outputting the delayed data, and respectively outputting the tap values C(0), C(−1), ..., and C(1−M) at the same timing as the pieces of n-th to (n+M−1)-th data, a multiplication step of respectively multiplying the pieces of n-th to (n+M−1)-th data which are output from the delay step by the tap values C(0), C(−1), ..., and C(1−M) which are output from the delay step and outputting the multiplied data, and an addition step of generating the emphasis waveform pattern by adding output values of the multiplication step.

Further, in the emphasis switching method according to the present invention, the emphasis addition step may include outputting a plurality of pieces of data included in the emphasis waveform pattern at the same clock timing.

Further, in the emphasis switching method according to the present invention, the tap value setting step may include selecting, from an emphasis setting table that stores a plurality of sets of the tap values C(0), C(−1), ..., and C(1−M) defined by a standard, the tap values C(0), C(−1), ..., and C(1−M) to be newly set to each FIR filter unit according to the switching request from the device under test and outputting the selected tap values C(0), C(−1), ..., and C(1−M) from the emphasis setting table.

Advantage of the Invention

The present invention provides a signal generator capable of flexibly increasing the number of taps while realizing high-speed emphasis switching and an emphasis switching method using the signal generator.

BRIEF DESCRIPTION OF THE DRAWINGS

FIG. 6 is a table for explaining outputs of the emphasis addition circuit for each clock.

BEST MODE FOR CARRYING OUT THE INVENTION

Hereinafter, an embodiment of a signal generator according to the present invention and an emphasis switching method using the signal generator will be described with reference to the drawings.

Figure 1:
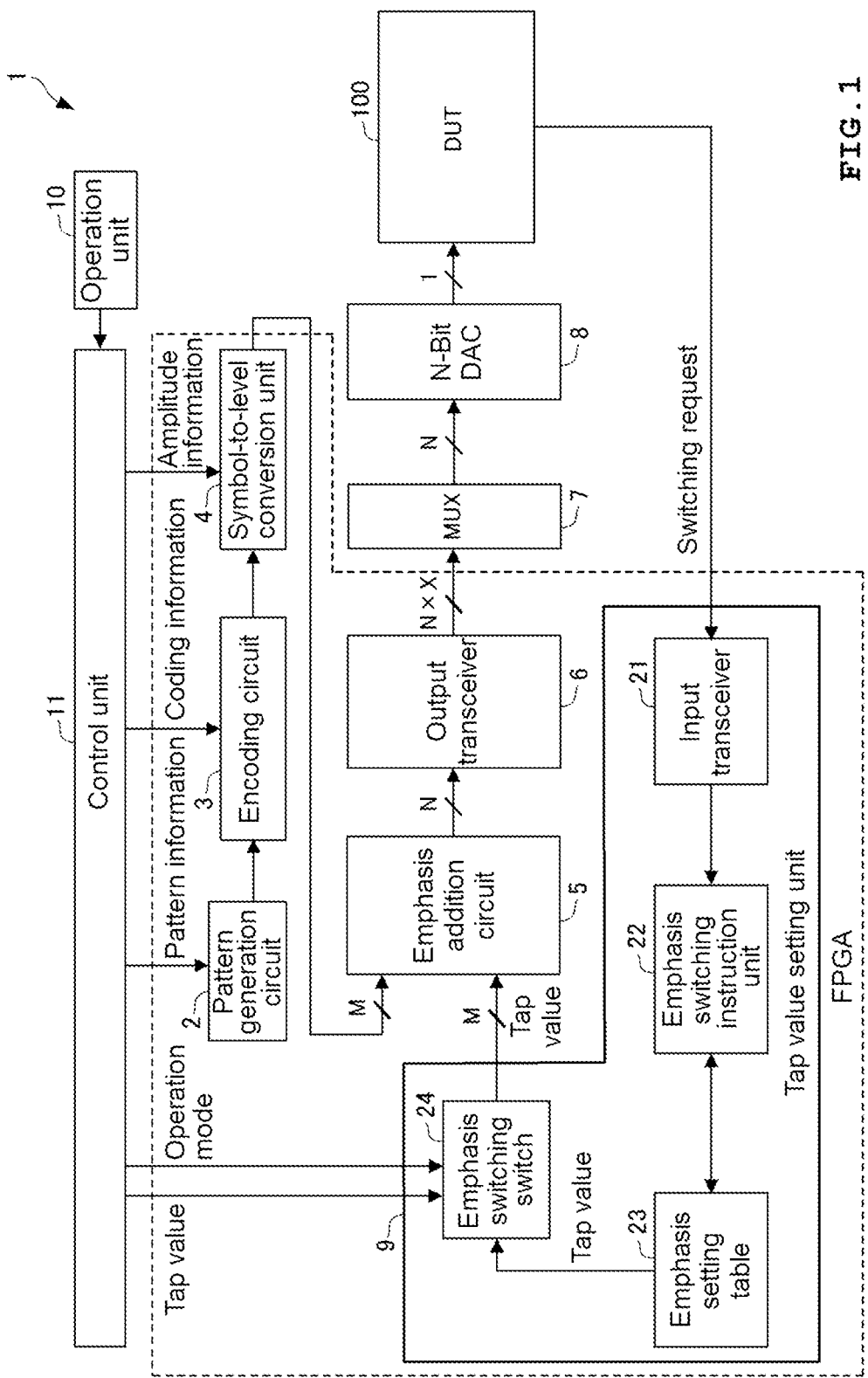
FIG. 1 is a block diagram illustrating a configuration of a signal generator according to an embodiment of the present invention.

A signal generator 1 according to the present embodiment illustrated in FIG. 1 includes a pattern generation circuit 2, an encoding circuit 3, a symbol-to-level conversion unit 4, an emphasis addition circuit 5, an output transceiver 6, a multiplexer (MUX) 7, an N-bit digital-to-analog converter (DAC) 8, a tap value setting unit 9, an operation unit 10, and a control unit 11. Note that the pattern generation circuit 2, the encoding circuit 3, the symbol-to-level conversion unit 4, the emphasis addition circuit 5, the output transceiver 6, and the tap value setting unit 9 are configured on, for example, an FPGA or an application specific integrated circuit (ASIC). On the other hand, in the following description, it is assumed that these components are configured on the FPGA.

The pattern generation circuit 2 generates a pattern of a PAM signal including multi-values K (K is an integer equal to or larger than two), which are two or more values synchronized with a clock of a predetermined cycle, based on pattern information that is input from the control unit 11. The pattern generation circuit 2 generates, for example, a pattern of a certain PAM signal including multi-values K, such as an NRZ signal (K=2), a PAM3 signal (K=3), a PAM4 signal (K=4), a PAM5 signal (K=5), a PAM6 signal (K=6), a PAM7 signal (K=7), or a PAM8 signal (K=8). Here, the pattern information is information of a pattern of a PAM signal, such as a K value and a type of a pattern (for example, a pseudo random binary sequence (PRBS) pattern, a short stress pattern random quaternary (SSPRQ) pattern, or a certain pattern), and can be set by a user's operation input to the operation unit 10.

The encoding circuit 3 performs coding such as gray coding or precoding on a PAM symbol included in the pattern of the PAM signal that is generated by the pattern generation circuit 2 based on coding information that is input from the control unit 11. Here, the coding information is information indicating whether or not gray coding or precoding is to be performed, and can be set by a user's operation input to the operation unit 10.

For example, in a case where gray coding processing on a PAM symbol is set to ON in advance by a user's operation input to the operation unit 10, the encoding circuit 3 performs gray coding on a PAM symbol. On the other hand, in a case where gray coding processing is set to OFF in advance by a user's operation input to the operation unit 10, the encoding circuit 3 does not perform gray coding on a PAM symbol. Similarly, in a case where precoding processing is set to ON in advance by a user's operation input to the operation unit 10, the encoding circuit 3 performs precoding on a PAM symbol. On the other hand, in a case where precoding processing is set to OFF in advance by a user's operation input to the operation unit 10, the encoding circuit 3 does not perform precoding on a PAM symbol.

The symbol-to-level conversion unit 4 converts the PAM symbol that is included in the pattern of the PAM signal and is output from the encoding circuit 3 into data $a_n$ including amplitude values within, for example, a range from −1 to 1, based on amplitude information that is input from the control unit 11. Here, the amplitude information is, for example, in a case of a PAM4 signal (K=4), information in which a PAM symbol "00" is associated with an amplitude value "−1", a PAM symbol "01" is associated with an amplitude value "−0.33", a PAM symbol "10" is associated with an amplitude value "0.33", and a PAM symbol "11" is associated with an amplitude value "1", and can be set by a user's operation input to the operation unit 10. That is, an amplitude ratio of an eye of the PAM signal that is finally output from the N-bit DAC 8 changes according to a level of the amplitude value determined by the amplitude information.

The emphasis addition circuit 5 includes at least one FIR filter unit 50 (refer to FIG. 2 and FIG. 4) that generates an emphasis waveform pattern by adding an emphasis to the pattern of the PAM signal that is output from the symbol-to-level conversion unit 4.

Figure 2:
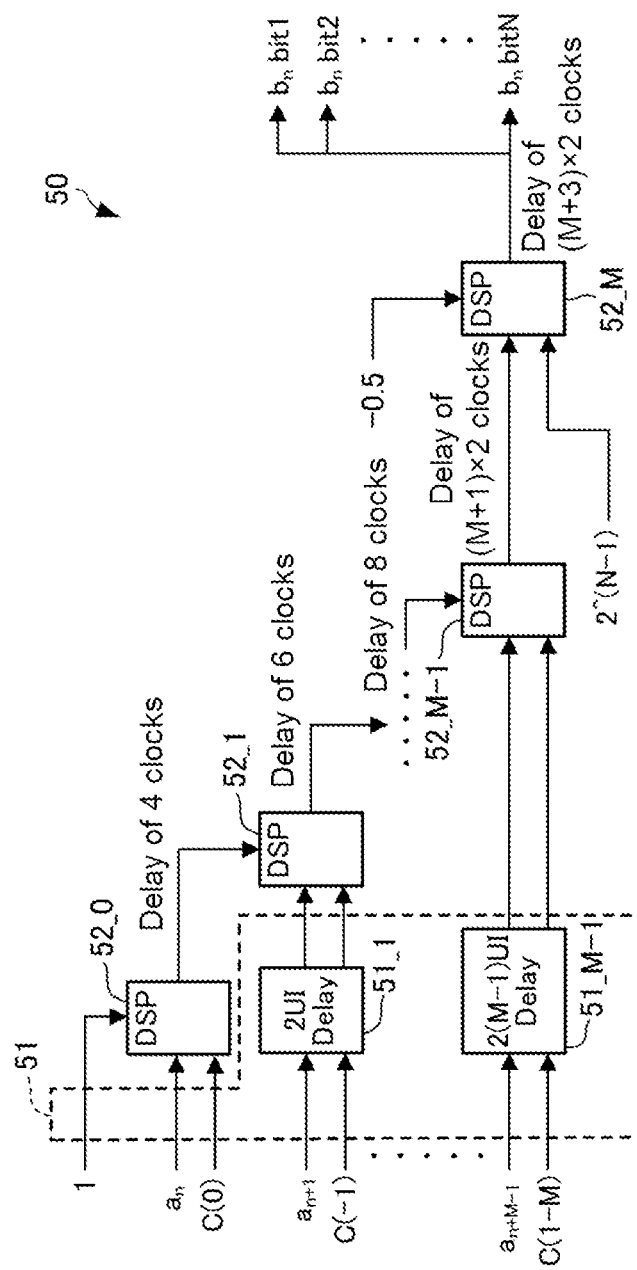
FIG. 2 is a circuit diagram (part 1) illustrating a schematic configuration of an FIR filter unit of an emphasis addition circuit included in the signal generator according to the embodiment of the present invention.

As illustrated in FIG. 2, the FIR filter unit 50 of which the number of taps is M includes M−1 delay circuits 51_1 to 51_M−1 included in a delay unit 51 and M+1 digital signal processors (DSPs) 52_0 to 52_M. The number M of taps is limited by a capacity of the FPGA, but can be set to a certain value. Configurations of the M+1 DSPs 52_0 to 52_M may all be the same. In the following description, each DSP may be denoted by a reference numeral 52 in some cases. Each FIR filter unit 50 is configured on, for example, an FPGA or an ASIC.

The delay circuits 51_1 to 51_M−1 respectively delay pieces of data $a_{n+1}$, $a_{n+2}$, . . . , and $a_{n+M-1}$ of (n+1)-th to (n+M−1)-th PAM symbols among pieces of data $a_n$, $a_{n+1}$, . . . , and $a_{n+M-1}$ of n-th to (n+M−1)-th PAM symbols, which are output from the symbol-to-level conversion unit 4 at the same clock timing, by a predetermined delay amount with respect to pieces of data $a_n$, $a_{n+1}$, . . . , and $a_{n+M-2}$ immediately before the pieces of data $a_{n+1}$, $a_{n+2}$, . . . , and $a_{n+M-1}$, and output the pieces of delayed data. In addition, the delay unit 51 respectively outputs M tap values C(0), C(−1), . . . , and C(1−M), which are set by a tap value setting unit 9 to be described later, at the same timing as the timing of the pieces of n-th to (n+M−1)-th data $a_n$, $a_{n+1}$, . . . , and $a_{n+M-1}$. The delay circuits 51_1, 51_2, . . . , and 51_M−1 are configured with, for example, D flip-flops.

Figure 3:
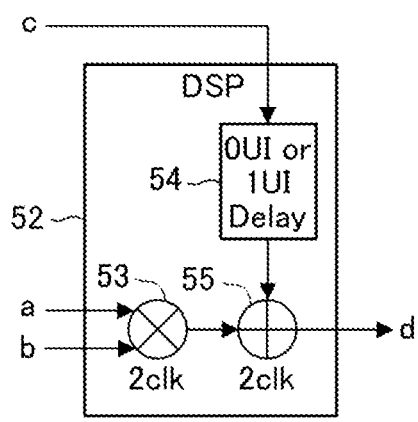
FIG. 3 is a circuit diagram illustrating a schematic configuration of a DSP included in the FIR filter unit.

As illustrated in FIG. 3, the DSP 52 includes a multiplier 53 that outputs a value a×b obtained by multiplying an input value a and an input value b, a delay circuit 54 that delays an input value c by 0 UI or 1 UI and outputs the delayed input value c, and an adder 55 that outputs a value d obtained by adding the output value a×b of the multiplier 53 and the output value c of the delay circuit 54. Both the multiplication processing of the multiplier 53 and the addition processing of the adder 55 require a time for two clocks, that is, 2 UI.

That is, in a case where a delay amount of the delay circuit 54 is 0 UI, the output value d of the DSP 52 is delayed by 4 clocks from the input of the input values a and b and is delayed by 2 clocks from the input of the input value c. On the other hand, in a case where a delay amount of the delay circuit 54 is 1 UI, the output value d of the DSP 52 is delayed by 4 clocks from the input of the input values a and b and is delayed by 3 clocks from the input of the input value c.

FIG. 2 is a circuit diagram illustrating a configuration of the FIR filter unit 50 in a case where a delay amount of the delay circuit 54 of the DSP 52 is 0 UI. In the configuration illustrated in FIG. 2, the multipliers 53 of the DSPs 52_0 to 52_M−1 respectively multiply the pieces of data $a_n$, $a_{n+1}$, . . . , and $a_{n+M-1}$ of the n-th to (n+M−1)-th PAM symbols that are output from the delay unit 51 by the tap values C(0), C(−1), . . . , and C(1−M) that are output from the delay unit 51, and output the pieces of multiplied data. Here, the tap values C(0), C(−1), . . . , and C(1−M) are values within a range from −1 to 1, and a sum of absolute values of the tap values C(0), C(−1), . . . , and C(1−M) is 1.

The delay circuit 51_1 delays the data $a_{n+1}$ of the (n+1)-th PAM symbol and the tap value C(−1) by 2 UI. Similarly, the delay circuit 51_M−1 delays the data $a_{n+M−1}$ of the (n+M−1)-th PAM symbol and the tap value C(1−M) by 2(M−1) UI.

The multiplier 53 of the DSP 52_0 multiplies the data an of the n-th PAM symbol by the tap value C(0), the data $a_n$ and the tap value C(0) not being delayed. The multiplier 53 of the DSP 52_1 multiplies the data $a_{n+1}$ of the (n+1)-th PAM symbol by the tap value C(−1), the data $a_{n+1}$ and the tap value C(−1) being delayed by the delay circuit 51_1 by 2 UI. Similarly, the multiplier 53 of the DSP 52_M−1 multiplies the data $a_{n+M−1}$ of the (n+M−1)-th PAM symbol by the tap value C(1−M), the data $a_{n+M−1}$ and the tap value C(1−M) being delayed by the delay circuit 51_M−1 by 2(M−1) UI.

The adder 55 of the DSP 52_0 adds a constant 1 to the output value of the multiplier 53 of the DSP 52_0. The constant 1 added by the adder 55 of the DSP 52_0 is a numerical value for adjusting the output from the FIR filter unit 50, that is, the input to the N-bit DAC 8 to be an integer within a range from 0 to $2^N−1$. In a case where the output value from the FIR filter unit 50 is set to a value other than an integer within a range from 0 to $2^N−1$, the constant added by the adder 55 of the DSP 52_0 may be appropriately set to another appropriate value.

The adders 55 of the DSPs 52_0 to 52_M−1 generate emphasis waveform patterns by adding the output values of the multipliers 53 of the DSPs 52_0 to 52_M−1. The adder 55 of the DSP 52_1 adds the output value of the adder 55 of the DSP 52_0 and the output value of the multiplier 53 of the DSP 52_1. Similarly, the adder 55 of the DSP 52_M−1 adds the output value of the adder 55 of the DSP 52_M−2 and the output value of the multiplier 53 of the DSP 52_M−1.

The multiplier 53 of the DSP 52_M multiplies the output value of the adder 55 of the DSP 52_M−1 by a constant $2^{N−1}$. In addition, the adder 55 of the DSP 52_M obtains N-bit data $b_n$ of an emphasis waveform pattern by adding a constant −0.5 to the output value of the multiplier 53 of the DSP 52_M. Further, the DSP 52_M expands the obtained N-bit data $b_n$ of the emphasis waveform pattern to N lanes, and outputs the expanded N-bit data $b_n$.

The constants $2^{N−1}$ and −0.5 that are input to DSP 52_M are numerical values for adjusting the input to the N-bit DAC 8 to be an integer within a range from 0 to $2^N−1$. In a case where the output value from the FIR filter unit 50 is set to a value other than an integer within a range from 0 to $2^N−1$, the constants $2^{N−1}$ and −0.5 may be appropriately set to other appropriate values. Here, the DSP 52_M and the DSP 52_0 configure an N-bit conversion unit that generates an N-bit emphasis waveform pattern by converting the output values of the multipliers 53 of the M DSPs 52_0 to 52_M−1, which are obtained after being added by the adders 55 of the M DSPs 52_0 to 52_M−1, into integer values within a range from 0 to $2^N−1$.

In a case where a timing at which the pieces of data $a_n$, $a_{n+1}$, . . . , and $a_{n+M−1}$ of the n-th to (n+M−1)-th PAM symbols are output from the symbol-to-level conversion unit 4 is set as a reference, the delay amount of the output value of the adder 55 of the DSP 52_0 is 4 clocks, and the delay amount of the output value of the adder 55 of the DSP 52_1 is 6 clocks. Similarly, the delay amount of the output value of the adder 55 of the DSP 52_M−1 is (M+1)×2 clocks. Further, the delay amount of the output value of the adder 55 of the DSP 52_M is (M+3)×2 clocks. That is, a total delay amount of the FIR filter unit 50 illustrated in FIG. 2 is (M+3)×2 clocks.

Figure 4:
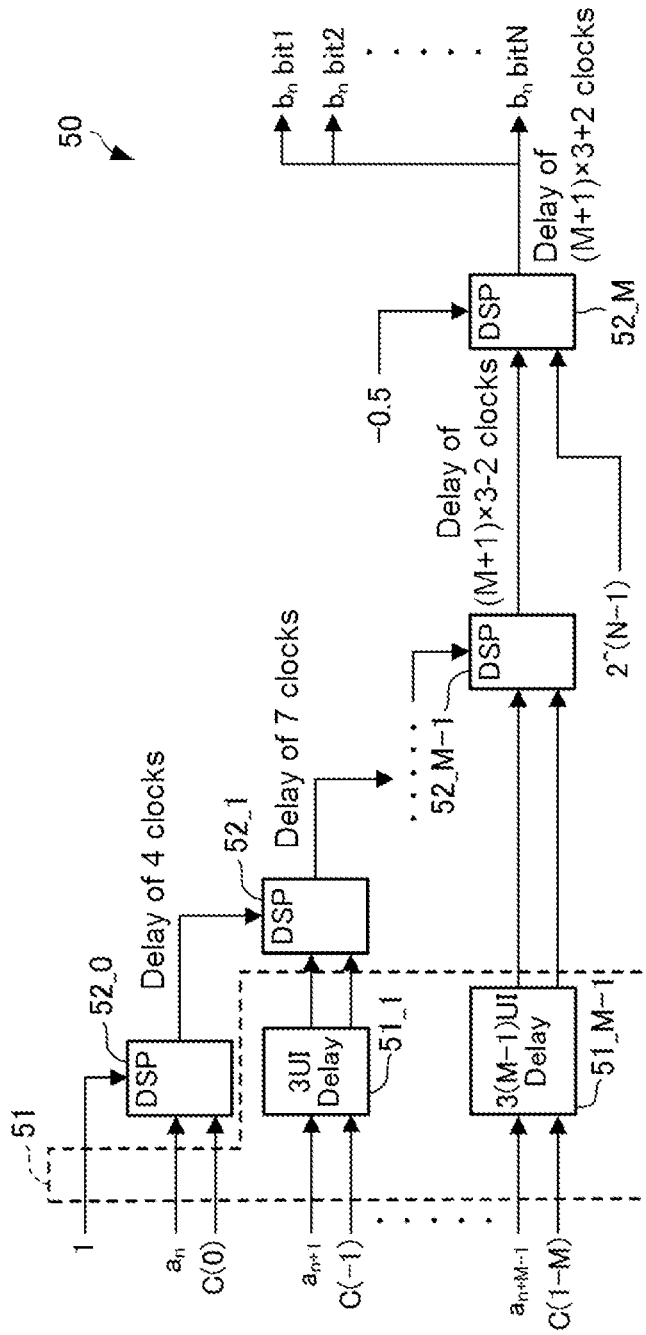
FIG. 4 is a circuit diagram (part 2) illustrating a schematic configuration of the FIR filter unit of the emphasis addition circuit included in the signal generator according to the embodiment of the present invention.

FIG. 4 is a circuit diagram illustrating a configuration of the FIR filter unit 50 in a case where the delay amount of the delay circuit 54 of the DSP 52 is 1 UI. The configuration of FIG. 2 and the configuration of FIG. 4 are the same except that the delay amount of the delay circuit 54 of the DSP 52 and the delay amounts of the delay circuits 51_1 to 51_M−1 are different.

In the configuration illustrated in FIG. 4, the delay circuit 51_1 delays the data $a_{n+1}$ of the (n+1)-th PAM symbol and the tap value C(−1) by 3 UI. Similarly, the delay circuit 51_M−1 delays the data $a_{n+M−1}$ of the (n+M−1)-th PAM symbol and the tap value C(1−M) by 3(M−1) UI.

In a case where a timing at which the pieces of data $a_n$, $a_{n+1}$, . . . , and $a_{n+M−1}$ of the n-th to (n+M−1)-th PAM symbols are output from the symbol-to-level conversion unit 4 is set as a reference, the delay amount of the output value of the adder 55 of the DSP 52_0 is 4 clocks, and the delay amount of the output value of the adder 55 of the DSP 52_1 is 7 clocks. Similarly, the delay amount of the output value of the adder 55 of the DSP 52_M−1 is (M+1)×3−2 clocks. Further, the delay amount of the output value of the adder 55 of the DSP 52_M is (M+1)×3+2 clocks. That is, a total delay amount of the FIR filter unit 50 illustrated in FIG. 4 is (M+1)×3+2 clocks.

According to the configuration of the FIR filter unit 50 illustrated in FIG. 2 and FIG. 4, data $b_0$ of a first term of the data $b_n$ that is the input to the N-bit DAC 8 is represented by the following Equation (1) using the pieces of data $a_0$, $a_1$, . . . , and $a_{M−}$.

[Equation 1]

$$b_0 = \{a_0 \times C(0) + a_1 \times C(-1) + \ldots + a_{M-1} \times C(1-M) + 1\} \times \frac{2^N - 1}{2} = \left\{\sum_{k=1}^{M} a_{k-1} \times C(1-k) + 1\right\} \times \frac{2^N - 1}{2} \quad (1)$$

Similarly, data $b_1$ is represented by the following Equation (2) using the pieces of data $a_1$, $a_2$, . . . , and $a_M$.

[Equation 2]

$$b_1 = \{a_1 \times C(0) + a_2 \times C(-1) + \ldots + a_M \times C(1-M) + 1\} \times \frac{2^N - 1}{2} = \left\{\sum_{k=1}^{M} a_k \times C(1-k) + 1\right\} \times \frac{2^N - 1}{2} \quad (2)$$

Therefore, a general term of the data $b_n$ is represented by the following Equation (3) using the pieces of data $a_n$, $a_{n+1}$, . . . , $a_{n+M−1}$. Here, the data $b_n$ represents integers within a range from 0 to $2^N−1$.

[Equation 3]

$$b_n = \left\{\sum_{k=1}^{M} a_{n+k-1} \times C(1-k) + 1\right\} \times \frac{2^N - 1}{2} \quad (3)$$

Figure 5:
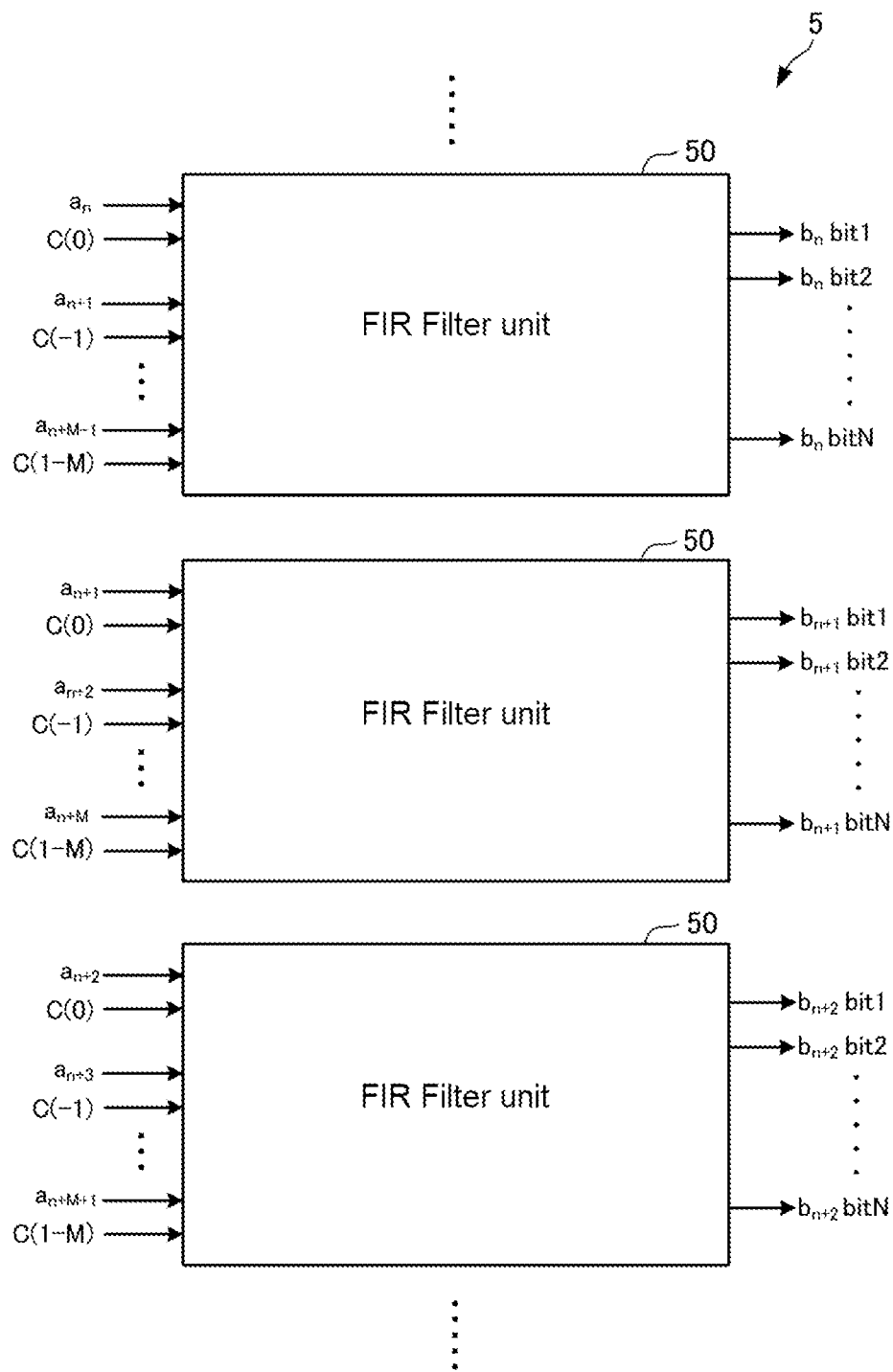
FIG. 5 is a block diagram illustrating a configuration of the emphasis addition circuit.

FIG. 2 and FIG. 4 illustrate the configuration in which the FIR filter unit 50 processes the pieces of data $a_n$, $a_{n+1}$, . . . , and $a_{n+M−1}$ corresponding to the number M of taps. On the other hand, the FPGA on which the emphasis addition circuit 5 is configured can simultaneously process the number of bits, such as 256 or 512, for each lane at the same clock. Therefore, as illustrated in FIG. 5, the emphasis addition circuit 5 can be configured by providing circuit configurations of a plurality of the FIR filter units 50 of FIG. 2 and FIG. 4 in parallel according to resources of the FPGA. That is, the emphasis addition circuit 5 configured as illustrated in FIG. 5 can output, for example, a plurality of pieces of data included in the pattern after emphasis addition, such as pieces of data $b_n$, $b_{n+1}$, $b_{n+2}$, and . . . , at the same clock timing.

For example, assuming that the number N of the output lanes of the emphasis addition circuit 5, that is, the number N of the bits of the data $b_n$ is 4 and that the number B of the bits to be processed in one clock for each output lane is 8-bit, the output of the data $b_n$ from the emphasis addition circuit 5 at a first clock and a second clock is as illustrated in FIG. 6. That is, the emphasis addition circuit 5 distributes the N bits included in the data $b_n$ to the N lanes bit by bit, and simultaneously outputs B pieces of data $b_{i \times B}$ to $b_{i \times B+B-1}$ in one clock. Here, i is an integer equal to or larger than 0. Note that the number N of the bits is not limited to the value and may be a certain value according to the number of bits of the input of the N-bit DAC 8.

The output transceiver 6 illustrated in FIG. 1 expands the N-bit data $b_n$ of the emphasis waveform pattern that is generated by the emphasis addition circuit 5 to N×X lanes, and outputs the expanded data. Here, X is an integer equal to or larger than 2. In the present embodiment, the output transceiver 6 is an output unit of the FPGA, and outputs a digital signal of 0 or 1 from each output lane.

The MUX 7 is provided to speed up a bit rate of the PAM signal that includes multi-values K and is output from the N-bit DAC 8 in the subsequent stage, and restores the N-bit data $b_n$ of the emphasis waveform pattern at a desired bit rate by multiplexing the N×X lane outputs of the output transceiver 6 to N lanes. Note that each of the N×X lane outputs of the output transceiver 6 is a digital signal of 0 or 1 and, in a case where the MUX 7 reads the digital signal at a predetermined clock, the emphasis addition to the pattern of the PAM signal by the emphasis addition circuit 5 is not lost.

The N-bit DAC 8 outputs, to a DUT 100, an analog signal according to the N-bit data $b_n$ of the emphasis waveform pattern that is restored by the MUX 7, that is, a PAM signal including multi-values K. Note that the MUX 7 and the N-bit DAC 8 may be separate or integrated. The PAM signal that is output from the N-bit DAC 8 is input to the DUT 100 as a test signal.

The DUT 100 receives the test signal that is output from the signal generator 1. In addition, the DUT 100 is configured to be able to output a switching request for switching an emphasis to be added to the input test signal. The switching request is expressed by, for example, a timing at which a switching request signal rises from 0 level to 1 level or a timing at which a switching request signal falls from 1 level to 0 level, the switching request signal having two values of 0 level and 1 level.

Examples of standards that the DUT 100 supports include PCIe Gen 1 to 6, USB 3.1 to 4, DP 1.4 to 2, common electrical interface (CEI), IEEE 802.3, InfiniBand, and the like. For example, in a case where the DUT 100 is provided with a link training and status state machine (LTSSM), the DUT 100 outputs a switching request in a case where a specific state transition occurs in the LTSSM.

Note that a normal N-bit DAC can generate an arbitrary waveform as in an arbitrary waveform generator (AWG) and thus it is also possible to directly output the pattern of the PAM signal to which the emphasis is added from the N-bit DAC 8 without using the emphasis addition circuit 5 according to the present embodiment. In this case, the emphasis can be switched by rewriting a value of a RAM directly connected to the N-bit DAC. However, depending on a pattern length to be set, writing the emphasis waveform pattern in a RAM takes a considerable amount of time of the order of several seconds to several tens of seconds. For this reason, in a configuration using an N-bit DAC as an AWG, high-speed emphasis switching cannot be performed.

On the other hand, in a case where the signal generator 1 according to the present embodiment is used, high-speed emphasis switching within 1 μs can be performed. Hereinafter, a configuration for performing emphasis switching, that is, tap value switching, in the signal generator 1 according to the present embodiment will be described.

The tap value setting unit 9 illustrated in FIG. 1 switches M tap values $C(0)$, $C(-1)$, . . . , and $C(1-M)$ and sets the M tap values $C(0)$, $C(-1)$, . . . , and $C(1-M)$ to each FIR filter unit 50 according to the emphasis switching request from the DUT 100 to which the test signal is input. The tap value setting unit 9 includes an input transceiver 21, an emphasis switching instruction unit 22, an emphasis setting table 23, and an emphasis switching switch 24.

The input transceiver 21 outputs the switching request that is output from the DUT 100 to the emphasis switching instruction unit 22.

The emphasis setting table 23 stores a plurality of sets of tap values $C(0)$, $C(-1)$, . . . , and $C(1-M)$ defined by a standard that the DUT 100 supports. In addition, the emphasis setting table 23 may store a set of tap values $C(0)$, $C(-1)$, . . . , and $C(1-M)$ that are arbitrarily set by a user's operation input to the operation unit 10.

The emphasis switching instruction unit 22 selects tap values $C(0)$, $C(-1)$, . . . , and $C(1-M)$ to be newly set to each FIR filter unit 50 from the emphasis setting table 23 according to the switching request that is input from the DUT 100 via the input transceiver 21, and outputs the selected tap values $C(0)$, $C(-1)$, . . . , and $C(1-M)$ from the emphasis setting table 23.

For example, in a case where the DUT 100 is provided with the LTSSM, the emphasis switching instruction unit 22 may recognize a transition state of the LTSSM from a state to another state based on the switching request which is output from the DUT 100. In this case, the emphasis switching instruction unit 22 can output, from the emphasis setting table 23, the tap values $C(0)$ to $C(1-M)$ corresponding to specific state transitions of the LTSSM.

The emphasis switching switch 24 outputs the tap values $C(0)$ to $C(1-M)$, which are output from the emphasis setting table 23, to each FIR filter unit 50 at a timing based on the switching request which is output from the DUT 100 in a case where an operation mode of the signal generator 1 is set to a standard mode by a user's operation input to the operation unit 10. Thereby, the new tap values $C(0)$ to $C(1-M)$ are set to each FIR filter unit 50.

On the other hand, the emphasis switching switch 24 outputs the tap values $C(0)$ to $C(1-M)$, which are arbitrarily set by a user's operation input to the operation unit 10, to each FIR filter unit 50 at a timing which is arbitrarily set by a user's operation input to the operation unit 10 in a case where an operation mode of the signal generator 1 is set to a user definition mode by a user's operation input to the operation unit 10. Thereby, the new tap values $C(0)$ to $C(1-M)$ are set to each FIR filter unit 50.

Note that the pieces of data $a_n$ to $a_{n+M-1}$ of the n-th to (n+M-1)-th PAM symbols are input to the DSP 52_0 and the delay circuits 51_1 to 51_M-1 of each FIR filter unit 50 at the same clock timing. In addition, the M tap values C(0) to C(1−M) are input to the DSP 52_0 and the delay circuits 51_1 to 51_M−1 at the same timing as the pieces of data $a_n$ to $a_{n+M-1}$ of the n-th to (n+M−1)-th PAM symbols in a case where the tap value setting unit 9 sets the tap values, and are continuously input to the DSP 52_0 and the delay circuits 51_1 to 51_M−1 until a new switching request occurs thereafter. On the other hand, the constant 1 which is input to the DSP 52_0 and the constants $2^{N-1}$ and −0.5 which are input to the DSP 52_M are continuously input to the DSP 52_0 and the DSP 52_M.

Hereinafter, a time required for emphasis switching by the signal generator 1 according to the present embodiment will be described.

First, the output transceiver 6 requires a time of approximately 4 clocks to expand the N-bit data $b_n$ of the emphasis waveform pattern that is input from the emphasis addition circuit 5 to the N×X lanes and output the expanded data. In addition, the input transceiver 21 requires a time of approximately 4 clocks to output the switching request that is output from the DUT 100 to the emphasis switching instruction unit 22.

The emphasis switching instruction unit 22 requires a time of approximately 3 clocks to output the tap values C(0) to C(1−M) to be set to each FIR filter unit 50 from the emphasis setting table 23 after the switching request is input from the input transceiver 21.

Further, in a case where the delay amount of the delay circuit 54 of the DSP 52 is 1 UI and the number M of taps of the FIR filter unit 50 is 5, the total delay amount of the FIR filter unit 50 is a time of (M+1)×3+2 clocks=20 clocks.

That is, a time required for emphasis switching in the FPGA of the signal generator 1 is a time of approximately 31 clocks. For this reason, for example, in a case where the test signal is a PAM4 signal of 32 Gbaud and an operation clock frequency in the FPGA for the test signal is 125 MHz, the time of approximately 31 clocks is approximately 248 ns. In addition, although there are delay times in hardware parts such as signal transmission/reception units of the MUX 7, the N-bit DAC 8, and the DUT 100, even in a case where all the delay times are added up, the total delay time is approximately several ns to several tens ns. For this reason, the delay time in a case where both the delay time in the FPGA and the delay times in the hardware parts are considered is estimated to be approximately 300 ns at most. Therefore, the signal generator 1 according to the present embodiment can realize high-speed emphasis switching satisfying a switching time equal to or shorter than 1 μs that is required by PCIe.

In addition, the signal generator 1 according to the present embodiment uses the FPGA with a higher operation clock frequency. Thereby, it is possible to further shorten a processing time in the FPGA, and realize higher-speed emphasis switching.

The operation unit 10 is for receiving a user's operation input, and is configured by, for example, a touch panel including a touch sensor for detecting a contact position by a contact operation on an input surface corresponding to a display screen of a display device. Alternatively, the operation unit 10 may include an input device such as a keyboard or mouse. The operation input to the operation unit 10 is detected by the control unit 11. For example, the operation unit 10 allows the user to arbitrarily perform selection of the pattern information to be input to the pattern generation circuit 2, the coding information to be input to the encoding circuit 3, the amplitude information to be input to the symbol-to-level conversion unit 4, the tap values C(0), C(−1), . . . , and C(1−M) to be input to the FIR filter unit 50, and the operation mode, and setting such as selection of the standard that the DUT 100 supports.

The control unit 11 is configured by a microcomputer or a personal computer including, for example, a central processing unit (CPU), a read only memory (ROM), a random access memory (RAM), a hard disk drive (HDD), and the like, and controls operations of the units included in the signal generator 1 according to a program that is stored in advance in the ROM.

Figure 7:
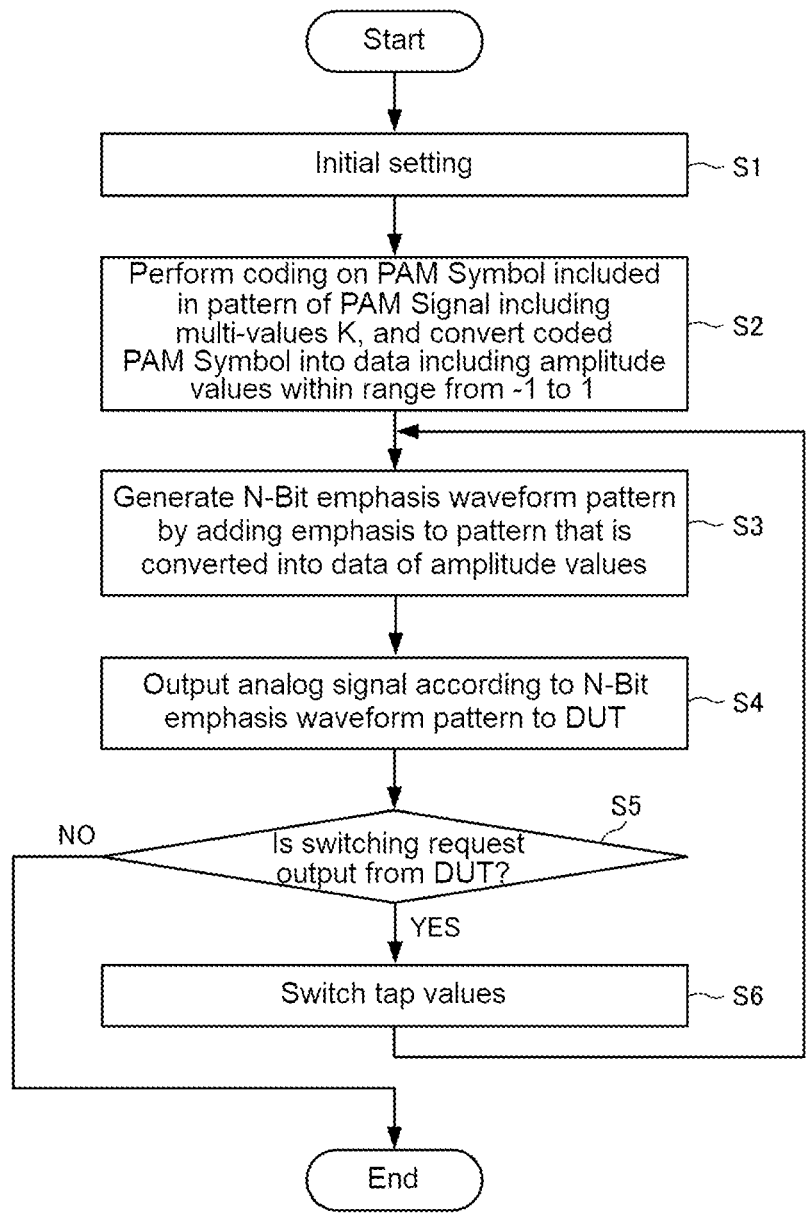
FIG. 7 is a flowchart illustrating processing of an emphasis switching method using the signal generator according to the embodiment of the present invention.
Figure 8:
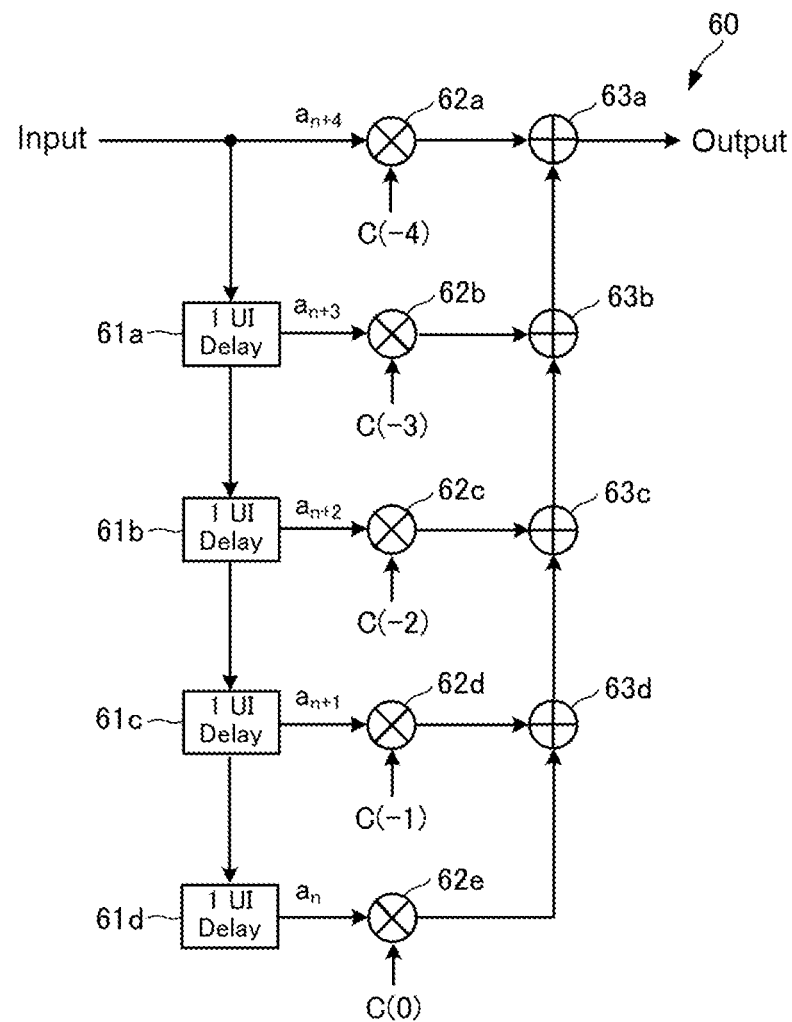
FIG. 8 is a circuit diagram illustrating a schematic configuration of an FIR filter used for emphasis addition in the related art.

Hereinafter, an example of processing in the emphasis switching method using the signal generator 1 according to the present embodiment will be described with reference to a flowchart of FIG. 7.

First, the control unit 11 performs initial setting (step S1) on the pattern information to be input to the pattern generation circuit 2, the coding information to be input to the encoding circuit 3, the amplitude information to be input to the symbol-to-level conversion unit 4, the tap values C(0), C(−1), . . . , and C(1−M) to be input to the FIR filter unit 50, and the like by the user's operation input to the operation unit 10.

Next, in step S2, the pattern generation circuit 2 generates a pattern of a PAM signal including multi-values K, which are two or more values, based on the pattern information which is set in step S1. The encoding circuit 3 performs gray coding or precoding on the PAM symbols included in the pattern of the PAM signal that is generated by the pattern generation circuit 2 based on the coding information which is set in step S1. The symbol-to-level conversion unit 4 converts the PAM symbol which is output from the encoding circuit 3 into data $a_n$ of amplitude values within a range from −1 to 1 based on the amplitude information which is set in step S1.

Next, the emphasis addition circuit 5 generates an emphasis waveform pattern (emphasis addition step S3) by adding an emphasis to the pattern of the PAM signal that is converted into the data a n of the amplitude values in step S2 by using each FIR filter unit 50 based on the tap values which are set in step S1 or step S6 to be described later.

Note that the emphasis addition step S3 includes a delay step, a multiplication step, an addition step, and an N-bit conversion step.

The delay step is a step of delaying, among pieces of data $a_n$ to $a_{n+M-1}$ of n-th to (n+M−1)-th PAM symbols included in the pattern of the PAM signal, pieces of (n+1)-th to (n+M−1)-th data $a_{n+1}$ to $a_{n+M-1}$ by a predetermined delay amount with respect to pieces of data $a_n$ to $a_{n+M-2}$ immediately before the pieces of data $a_{n+1}$ to $a_{n+M-1}$ and outputting the delayed data, and outputting M tap values C(0), C(−1), . . . , and C(1−M) at the same timing as the pieces of n-th to (n+M−1)-th data $a_n$ to $a_{n+M-1}$.

The multiplication step is a step of respectively multiplying the pieces of data $a_n$ to $a_{n+M-1}$ of n-th to (n+M−1)-th PAM symbols that are output from the delay step by the M tap values C(0), C(−1), . . . , and C(1−M) that are output from the delay step and outputting the multiplied data.

The addition step is a step of generating an emphasis waveform pattern by adding output values of the multiplication step. The N-bit conversion step is a step of generating an N-bit emphasis waveform pattern by converting the output values of the multiplication step, which are obtained after being added by the addition step, into integer values within a range from 0 to $2^N-1$.

Next, in step S4, the output transceiver 6 expands the N-bit emphasis waveform pattern that is output from the emphasis addition circuit 5 to N×X lanes, and outputs the expanded N-bit emphasis waveform pattern. The MUX 7 restores the N-bit emphasis waveform pattern by multiplexing the output of the output transceiver 6 to N lanes, and outputs the restored N-bit emphasis waveform pattern to the N-bit DAC 8. The N-bit DAC 8 outputs an analog signal according to the N-bit emphasis waveform pattern that is restored by the MUX 7 to the DUT 100.

Next, the emphasis switching instruction unit 22 determines whether or not a switching request is output from the DUT 100 (step S5).

In a case where a switching request is output from the DUT 100, the emphasis switching instruction unit 22 selects, from the emphasis setting table 23, new M tap values C(0), C(−1), . . . , and C(1−M) to be set to each FIR filter unit 50, outputs the selected new tap values C(0), C(−1), . . . , and C(1−M) from the emphasis setting table 23, and sets the selected new tap values C(0), C(−1), . . . , and C(1−M) to each FIR filter unit 50 (tap value setting step S6). That is, in the tap value setting step S6, the emphasis switching instruction unit 22 switches the tap values C(0), C(−1), . . . , and C(1−M) which are already set to each FIR filter unit 50 to new tap values C(0), C(−1), . . . , and C(1−M) and sets the new tap values C(0), C(−1), . . . , and C(1−M) to each FIR filter unit 50 according to the switching request. In a case where the tap value setting step S6 is executed, processing of step S3 and subsequent steps is executed again.

As described above, the signal generator 1 according to the present embodiment can add an emphasis to a pattern of a PAM signal including multi-values, which are two or more values, by using at least one FIR filter unit 50. In addition, the signal generator 1 according to the present embodiment can switch a final output waveform at a high speed by switching the M tap values C(0), C(−1), . . . , and C(1−M) to be input to each FIR filter unit 50. Further, in the signal generator 1 according to the present embodiment, the emphasis addition circuit 5 including at least one FIR filter unit 50 is configured on the FPGA or the ASIC. Thereby, even in a case where the number of required taps increases due to a future standard trend, it is possible to flexibly increase the number M of taps and the number N of output bits while realizing high-speed emphasis switching.

Further, the signal generator 1 according to the present embodiment can select, from the emphasis setting table 23, the tap values C(0), C(−1), . . . , and C(1−M) according to a switching request from the DUT 100, and set the selected tap values C(0), C(−1), . . . , and C(1−M) to each FIR filter unit 50.

Further, in the signal generator 1 according to the present embodiment, each FIR filter unit 50 is configured using the DSP 52. Thereby, it is possible to efficiently use resources of the FPGA or the ASIC, and it is possible to flexibly increase the number M of taps and the number N of output bits in a case where the number of required taps increases due to a future standard trend.

Further, the signal generator 1 according to the present embodiment is configured to input the N-bit emphasis waveform pattern from the emphasis addition circuit 5 to the N-bit DAC 8 and generate the test signal for the DUT 100. Thereby, it is possible to increase a bit rate and add an emphasis. Therefore, it is possible to realize a signal generator with high waveform switching performance according to the multi-values.

DESCRIPTION OF REFERENCE NUMERALS AND SIGNS

1: Signal generator
2: Pattern generation circuit
3: Encoding circuit
4: Symbol-to-level conversion unit
5: Emphasis addition circuit
6: Output transceiver
7: MUX
8: N-bit DAC
9: Tap value setting unit
10: Operation unit
11: Control unit
21: Input transceiver
22: Emphasis switching instruction unit
23: Emphasis setting table
24: Emphasis switching switch
50: FIR filter unit
51: Delay unit
51_1 to 51_M−1: Delay circuit
52, 52_0 to 52_M: DSP
53: Multiplier
54: Delay circuit
55: Adder
60: FIR filter
100: DUT

What is claimed is:

1. A signal generator comprising:
an emphasis addition circuit including at least one finite impulse response (FIR) filter unit that generates an emphasis waveform pattern by adding an emphasis to a pattern of a pulse amplitude modulation (PAM) signal including multi-values which are two or more values; and
a tap value setting unit that switches M tap values C(0), C(−1), . . . , and C(1−M) and sets the M tap values C(0), C(−1), . . . , and C(1−M) to the at least one FIR filter unit according to an emphasis switching request from a device under test,
wherein the at least one FIR filter unit includes:
a delay unit that respectively delays pieces of n-th to (n+M−1)-th data included in the pattern of the PAM signal by a predetermined delay amount with respect to the data immediately before each of the pieces of the (n+1)-th to (n+M−1)-th data and outputs the delayed data, and that respectively outputs the M tap values C(0), C(−1), . . . , and C(1−M) at the same timing as the pieces of the n-th to (n+M−1)-th data,
a plurality of multipliers that respectively multiply the pieces of the n-th to (n+M−1)-th data which are output from the delay unit by the M tap values C(0), C(−1), . . . , and C(1−M) which are output from the delay unit and output multiplied data, and
a plurality of adders that generate the emphasis waveform pattern based on an addition of output values of the plurality of multipliers, and
the at least one FIR filter unit is configured on a field programmable gate array (FPGA) or an application specific integrated circuit (ASIC).

2. The signal generator according to claim 1, wherein the emphasis addition circuit is configured by providing a plurality of circuit configurations of the at least one FIR filter unit in parallel, and outputs a plurality of pieces of data included in the emphasis waveform pattern at the same clock timing.

3. The signal generator according to claim 1, wherein the tap value setting unit includes:
an emphasis setting table that stores a plurality of sets of the M tap values C(0), C(−1), . . . , and C(1−M) defined by a standard, and an emphasis switching instruction unit that selects, from the emphasis setting table, the M tap values C(0), C(−1), ..., and C(1−M) to be newly set to the at least one FIR filter unit according to the switching request from the device under test and outputs the selected M tap values C(0), C(−1), ..., and C(1−M) from the emphasis setting table.

4. The signal generator according to claim 1, wherein the plurality of multipliers and the plurality of adders are configured in a digital signal processor (DSP).

5. The signal generator according to claim 1, further comprising:
an N-bit digital-to-analog converter (DAC) that outputs an analog signal according to the emphasis waveform pattern which is output from the emphasis addition circuit to the device under test, wherein N is a positive integer,
wherein the at least one FIR filter unit further includes an N-bit conversion unit that generates the emphasis waveform pattern by converting the output values of the plurality of multipliers, which are obtained after being added by the plurality of adders, into integer values within a range from 0 to $2^N-1$.

6. An emphasis switching method comprising:
an emphasis addition step of generating an emphasis waveform pattern by adding an emphasis to a pattern of a pulse amplitude modulation (PAM) signal including multi-values which are two or more values by at least one finite impulse response (FIR) filter unit configured on a field programmable gate array (FPGA) or an application specific integrated circuit (ASIC); and
a tap value setting step of switching M tap values C(0), C(−1), ..., and C(1−M) and setting the M tap values C(0), C(−1), ..., and C(1−M) to the at least one FIR filter unit according to an emphasis switching request from a device under test,
wherein the emphasis addition step includes:
a delay step of respectively delaying pieces of n-th to (n+M−1)-th data included in the pattern of the PAM signal by a predetermined delay amount with respect to the data immediately before each of the pieces of the (n+1)-th to (n+M−1)-th data and outputting the delayed data, and respectively outputting the M tap values C(0), C(−1), ..., and C(1−M) at the same timing as the pieces of the n-th to (n+M−1)-th data,
a multiplication step of respectively multiplying the pieces of the n-th to (n+M−1)-th data which are output from the delay step by the M tap values C(0), C(−1), ..., and C(1−M) which are output from the delay step and outputting multiplied data, and
an addition step of generating the emphasis waveform pattern based on an addition of output values of the multiplication step.

7. The emphasis switching method according to claim 6, wherein the emphasis addition step further includes outputting a plurality of pieces of data included in the emphasis waveform pattern at the same clock timing.

8. The emphasis switching method according to claim 6, wherein the tap value setting step includes selecting, from an emphasis setting table that stores a plurality of sets of the M tap values C(0), C(−1), ..., and C(1−M) defined by a standard, the M tap values C(0), C(−1), ..., and C(1−M) to be newly set to the at least one FIR filter unit according to the emphasis switching request from the device under test and outputting the selected M tap values C(0), C(−1), ..., and C(1−M) from the emphasis setting table.

* * * * *